United States Patent [19]

Schilling et al.

[11] Patent Number: 4,796,260

[45] Date of Patent: Jan. 3, 1989

[54] SCHILLING-MANELA FORWARD ERROR CORRECTION AND DETECTION CODE METHOD AND APPARATUS

[75] Inventors: Donald L. Schilling, Sands Point; David Manela, Kew Garden, both of N.Y.

[73] Assignee: SCS Telecom, Inc., Port Washington, N.Y.

[21] Appl. No.: 32,011

[22] Filed: Mar. 30, 1987

[51] Int. Cl.$^4$ .............................................. G06F 11/10
[52] U.S. Cl. ......................................................... 371/39
[58] Field of Search ........................ 371/35, 37, 38, 39, 371/40, 43, 50, 51

[56] References Cited

U.S. PATENT DOCUMENTS

| | | | |
|---|---|---|---|
| 3,475,724 | 10/1969 | Townsend et al. | 371/37 |
| 4,205,324 | 5/1980 | Patel | 371/50 |
| 4,435,807 | 3/1984 | Scott et al. | 371/50 |
| 4,716,567 | 12/1987 | Ito et al. | 371/40 |

OTHER PUBLICATIONS

John P. Robinson and Arthur J. Bernstein, "A Class of Binary Recurrent Codes with Limited Error Propagation", *IEEE Transactions on Information Theory*, vol. IT-13, No. 1, Jan., 1967, pp. 106-113.

Mario Blaum and Patrick G. Farrell, "A Class of Burst Error-Correcting Array Codes", *IEEE Transactions on Information Theory*, vol. IT-32, No. 6, Nov., 1986, pp. 836-839.

David M. Mandelbaum, "Some Classes of Multiple-Burst Error-Correct Codes Using Threshold Decoding", *IEEE Transactions on Information Theory*, vol. IT-18, No. 2, Mar. 1972, pp. 285-292.

*Primary Examiner*—Charles E. Atkinson
*Attorney, Agent, or Firm*—David B. Newman, Jr. & Associates

[57] ABSTRACT

A Schilling-Manela encoding method is provided comprising the steps of storing a block of a data-bit sequence in a memory, calculating parity-check symbols from parity-line symbols having p-bits per symbol along parity lines, and setting the parity-check symbols equal to the modulo-$2^p$ sum of the parity-line symbols. A Schilling-Manela decoding method is provided comprising the steps of storing an encoded data-bit sequence in a memory. The encoded-data-bit sequence includes a parity-check-symbol sequence which is stored in parity-memory cells, and a data-bit sequence which is blocked and stored in information-memory cells. The parity-check symbols and the parity-line symbols along the parity lines in the information-memory cells are found. The count of each composite cell on a composite-error graph traversed by the path of each of the parity lines having an error is incremented and the largest-number cell in the composite-error graph having the largest number is determined. The largest number is compared to a threshold, and a new data symbol is chosen to minimize the count in the largest-number cell and substituted into the stored data-bit sequence.

29 Claims, 15 Drawing Sheets

Fig. 2A $a_1 \quad a_2 \quad a_3 \quad \cdots \quad a_h$ $a_{h+1} \quad a_{h+2} \quad a_{h+3} \quad \cdots \quad a_{2h}$ $\cdot \quad\quad \cdot \quad\quad \cdot \quad\quad\quad\quad \cdot$ $\cdot \quad\quad \cdot \quad\quad \cdot \quad\quad\quad\quad \cdot$ $\cdot \quad\quad \cdot \quad\quad \cdot \quad\quad\quad\quad \cdot$ $a_{(g-1)h+1} \quad a_{(g-1)h+2} \quad a_{(g-1)h+3} \quad \cdots \quad a_{gh}$

Fig. 2B $a_1 \quad a_{g+1} \quad a_{2g+1} \quad \cdots \quad a_{(h-1)g+1}$ $a_2 \quad a_{g+2} \quad a_{2g+2} \quad \cdots \quad a_{(h-1)g+2}$ $\cdot \quad\quad \cdot \quad\quad \cdot \quad\quad\quad\quad \cdot$ $\cdot \quad\quad \cdot \quad\quad \cdot \quad\quad\quad\quad \cdot$ $\cdot \quad\quad \cdot \quad\quad \cdot \quad\quad\quad\quad \cdot$ $a_g \quad a_{2g} \quad a_{3g} \quad \cdots \quad a_{gh}$

Fig. 4A

```
ROW 1           1 0 1 1 0 1
    2           0 1 1 0 0 0
    3           1 0 1 1 1 1
    ─────────────────────────
    4           0 1 1 0 1 0           90° PARITY LINE
    5       1 0 1 0 1 0 1 1           +45° PARITY LINE
    6           1 0 1 0 0 0 0 1       -45° PARITY LINE
```

Fig. 4B

| ROW 1 | ROW 2 | ROW 3 | ROW 4 | ROW 5 | ROW 6 |
|---|---|---|---|---|---|
| 101101 | 011000 | 101111 | 011010 | 10101011 | 10100001 |

Fig. 4C

```
COLUMN  -2 -1  0  1  2  3  4  5  6  7  8  9
ROW 1            1  0  1  1  0  1
    2            0  1 (0) 0 (1) 0                    ─ ERROR BITS
    3            1  0  1  1  1  1
    ──────────────────────────────
    4            0  1  1  0  1  0
    5       1 0  1  0  1  0  1  1
    6               1  0  1  0  0  0  0  1
```

Fig. 4D

| | 1 | 2 | 3 | 4 | 5 | 6 |
|---|---|---|---|---|---|---|
| 1 | 0 | 0 | 1 | 0 | 1 | 0 |
| 2 | 0 | 0 | 1 | 0 | 1 | 0 |
| 3 | 0 | 0 | 1 | 0 | 1 | 0 |

VERTICAL CHECK

| | 1 | 2 | 3 | 4 | 5 | 6 |
|---|---|---|---|---|---|---|
| | 0 | 0 | 0 | 1 | 0 | 1 |
| | 0 | 0 | 1 | 0 | 1 | 0 |
| | 0 | 1 | 0 | 1 | 0 | 0 |

+45° DIAGONAL CHECK

| | 1 | 2 | 3 | 4 | 5 | 6 |
|---|---|---|---|---|---|---|
| | 0 | 1 | 0 | 1 | 0 | 0 |
| | 0 | 0 | 1 | 0 | 1 | 0 |
| | 0 | 0 | 0 | 1 | 0 | 1 |

−45° DIAGONAL CHECK

Fig. 4E

| | 1 | 2 | 3 | 4 | 5 | 6 |
|---|---|---|---|---|---|---|
| 1 | 0 | 1 | 1 | 2 | 1 | 1 |
| 2 | 0 | 0 | ③ | 0 | ③ | 0 |
| 3 | 0 | 1 | 1 | 2 | 1 | 1 |

Fig. 5

```
  1 0 1 1 0 1         ← CORRECTED BIT
  0 1 0 0 ⓪ 0
  1 0 1 1 1 1
  ─────────────
  0 1 1 0 1 0
1 0 1 0 1 0 1 1
  ─────────────
  1 0 1 0 0 0 0 1
```

Fig. 6A

|   | 1 | 2 | 3 | 4 | 5 | 6 |
|---|---|---|---|---|---|---|
| 1 | 0 | 1 | 1 | 1 | 0 | 0 |
| 2 | 0 | 0 | 3 | 0 | 0 | 0 |
| 3 | 0 | 1 | 1 | 1 | 0 | 0 |

Fig. 6B

```
CORRECTED BIT──      1 0 1 1 0 1
                     0 1 ①  0 0 0
                     1 0 1 1 1 1
                     ─────────────
                     0 1 1 0 1 0
             1 0 1 0 1 0 1 1
                     1 0 1 0 0 0 0 1
```

Fig. 7

|   | 1 | 2 | 3 | 4 | 5 | 6 |
|---|---|---|---|---|---|---|
| 1 | 1 | 0 | 0 | 0 | 0 | 0 |
| 2 | 0 | 0 | 0 | 0 | 0 | 0 |
| 3 | 0 | 0 | 0 | 0 | 0 | 0 |

Fig. 9A $$h=10$$

$$g=6 \begin{cases} 1 & 1 & 0 & 1 & 0 & 0 & 0 & 1 & 1 & 0 \\ 1 & 0 & 1 & 1 & 1 & 0 & 1 & 0 & 1 & 0 \\ 0 & 1 & 1 & 1 & 1 & 0 & 0 & 1 & 1 & 1 \\ 0 & 1 & 1 & 0 & 0 & 0 & 1 & 1 & 1 & 0 \\ 0 & 0 & 1 & 1 & 1 & 1 & 1 & 0 & 1 & 0 \\ 1 & 1 & 0 & 0 & 1 & 0 & 0 & 1 & 1 & 1 \end{cases}$$

Fig. 9B

| COLUMN: | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| $(pc)_2$: | 1 | 0 | 0 | 1 | 1 | 0 | 1 | 1 | 0 | 1 | 1 | 0 | 0 | 1 | 1 | |
| | | 1 | 1 | 0 | 1 | 0 | 0 | 0 | 1 | 1 | 0 | | | | | |
| | | 1 | 0 | 1 | 1 | 1 | 0 | 1 | 0 | 1 | 0 | | | | | |
| | | 0 | 1 | 1 | 1 | 1 | 0 | 0 | 1 | 1 | 1 | | | | | |
| | | 0 | 1 | 1 | 0 | 0 | 0 | 1 | 1 | 1 | 0 | | | | | |
| | | 0 | 0 | 1 | 1 | 1 | 1 | 1 | 0 | 1 | 0 | | | | | |
| | | 1 | 1 | 0 | 0 | 1 | 0 | 0 | 1 | 1 | 1 | | | | | |
| $(pc)_1$: | 1 | 0 | 0 | 0 | 0 | 1 | 1 | 0 | 0 | 0 | | | | | | |

Fig. 10

```
COLUMN    1  2  3  4  5  6  7  8  9 10 11 12 13 14 15
                              ERROR
(pc)₂        1  0  0  1  1  0  1  1  0  1  1  0  0  1
ROW 1        1  1  0  1  0  0  0  1  1  0
    2        1  0  1  0  1  0  1  0  1  0
    3        0  1  1  1  1  0  0  1  1  1
    4        0  1  1  0  0  0  1  1  1  0
    5        0  0  1  1  1  1  1  0  1  0
    6        1  1  0  0  1  0  0  1  1  1
(pc)₁        1  0  0  0  0  1  1  0  0  0
                        ERROR
```

Fig. 11A

```
ROW 1                    1 0 1 1 0 1
    2                    0 1 1 0 0 0
    3                    1 0 1 1 1 1
    4                1 0 1 0 1 0 1 1    SLOPE=+1 PARITY LINE
    5        1 0 1 0 0 1 1 1 1 1         SLOPE=+½ PARITY LINE
```

Fig. 11B

| ROW 1 | ROW 2 | ROW 3 | ROW 4 | ROW 5 |
|-------|-------|-------|-------|-------|
| 101101 | 011000 | 101111 | 10101011 | 1010011111 |

Fig. 11C

```
         COLUMN  1  2  3  4  5  6
ROW  1           0  1  0  0  1  0
     2           0  1  1  0  0  0
     3           1  0  1  1  1  1
                 ─────────────────
     4        1  0  1  0  1  0  1  1   pc+1
           1  0  1  0  0  1  1  1  1  1   pc+½
```

Fig. 11D

|   | 1 | 2 | 3 | 4 | 5 | 6 |
|---|---|---|---|---|---|---|
| 1 | ②| 2 | 2 | 2 | 2 | 2 |
| 2 | 2 | 2 | 2 | 2 | 1 | 0 |
| 3 | 2 | 2 | 1 | 1 | 0 | 0 |

INVERT THIS BIT

|   | 1 | 2 | 3 | 4 | 5 | 6 |
|---|---|---|---|---|---|---|
| 1 | 0 | ②| 2 | 2 | 2 | 2 |
| 2 | 2 | 2 | 2 | 2 | 1 | 0 |
| 3 | 2 | 2 | 1 | 1 | 0 | 0 |

INVERT THIS BIT

|   | 1 | 2 | 3 | 4 | 5 | 6 |
|---|---|---|---|---|---|---|
| 1 | 0 | 0 | ②| 2 | 2 | 2 |
| 2 | 1 | 2 | 2 | 2 | 1 | 0 |
| 3 | 2 | 2 | 1 | 1 | 0 | 0 |

*Fig. 12*

| ROW | COLUMN 4 |
|---|---|
| 1 | 1 |
| 2 | X |
| 3 | 1 |
| 4 | 0 |
| 5 | 1 |
| 6 | 0 |
| (pc) | 0 |

*Fig. 13*

DIAGONAL, d
DIAGONAL, e

|  | COLUMN | 4 | 5 | 6 |
|---|---|---|---|---|
|  |  |  | 1 | 0 |
| ROW | 1 | 0 | 1 | 0 | 0 |
|  | 2 | 1 | X | 1 |
|  | 3 | X | X |  |
|  | 4 | 1 | 1 | 0 |
|  | 5 | 1 | 0 | 1 | 1 |
|  | 6 | 0 | 1 | 0 | 0 |
|  |  |  | 0 | 0 |

SCHILLING-MANELA FORWARD ERROR CORRECTION AND DETECTION CODE METHOD AND APPARATUS

BACKGROUND OF THE INVENTION

This invention relates to forward error correction and detection codes, and more particularly to a forward error correction and detection code method and apparatus having parity check bits (or symbols) added to information bits (or symbols) to form a codeword.

RELATED PATENTS

This patent is related to the following patent applications: Donald L. Schilling and David Manela, "PASM and TASM Forward Error Correction and Detection Code Method and Apparatus," Ser. No. 07/080,767, filed Aug. 3, 1987; Donald L. Schilling and David Manela, "SM Codec Method and Apparatus," Ser. No. 07/122,948, filed Nov. 19, 1987; and, Donald L. Schilling and David Manela, "PASM and TASM Forward Error Correction and Detection Code Method and Apparatus," Ser. No. 07/119,932, filed Nov. 13, 1987.

DESCRIPTION OF THE PRIOR ART

A forward error correction (FEC) or detection code has r bits, called parity check bits, added to k information data bits to form an $n=k+r$ bit codeword. The r parity-check bits are added in such a way as to allow a specified number of errors to be detected or corrected. The algorithm employed to generate the r parity-check bits for given information bits differs for each code.

Specific forward error correction and detection codes which are well known in the prior art include the Reed-Solomon code, the Golay code, error correcting/detecting codes using the Hadamard matrix, the BCH code and the Hamming code. Each of these codes employs a different algorithm for generating the parity check bits and a different algorithm for recovering the original k data bits or for detecting errors. Texts describing such prior art codes include: H. Taub and D. L. Schilling, *Principles of Communication Systems*, 2 Ed., McGraw-Hill Book Company (1986); S. Lin and D. J. Costello, Jr., *Error Control Coding: Fundamentals and Applications*, Prentice-Hall, Inc., (1983); and R. G. Gallager, *Information Theory and Reliable Communications*, John Wiley and Sons, Inc., (1968).

The forward error correction and detection codes are characterized by their algorithm for encoding and decoding and also by several other properties:

1. Code rate, R: The code rate is the ratio of information data bits, k, to the sum, n, of information data bits and parity check bits, r. Thus, the number of bits in a codeword is $n=k+r$ and the code rate $R=k/n$.

2. Hamming distance. The minimum number of bits by which codewords differ is called the Hamming distance, d. If there are k information bits in an uncoded word, there are $2^k$ possible uncoded information words. For example, if $k=4$ there are 16 possible uncoded words: 0000,...,1111. An error in any bit will make the word look like a different one of the $2^k$ words and therefore an error cannot be detected or corrected. However, if r parity check bits are added to the k-bit uncoded word, an n-bit codeword is formed. Hence, there are $2^n$ possible words of which only $2^k$ are used. The selection of the codewords so as to ensure a maximum separation between the codewords is what makes a good code. For example, a Hamming code containing $k=4$ information bits and $n=7$ coded bits has $2^4=16$ codewords of a possible $2^7=128$ words. This is called a (n,k) or (7,4) code of rate $R=4/7$. These codewords are selected so that each codeword differs by 3 bits. Thus, a single error can be detected and corrected while two errors on a codeword cannot be corrected. In the above example, $d=3$.

3. Error Detection: In general, codes can detect $d-1$ errors in a codeword.

4. Error Correction: In general, a code can correct t errors in a codeword, where $$t \leq \frac{d_{min} - 1}{2} \text{ or } \frac{d_{min}}{2} - 1, \quad (1)$$

depending on whether d is odd or even, respectively. An approximate upper bound on the number of errors, t, that a code can correct is $$t \leq r/4 + \tfrac{1}{2} \quad (2)$$

5. Erasures: Side information can be used to ascertain that specific bit(s) in a codeword had an increased probability of error. On such occasions those bits can be erased, replacing them by an X rather than by a 1 or 0 in the decoding algorithm. The number of erasures that a code can correct in a codeword is $$E \leq d - 1 \quad (3)$$

If errors and erasures can both occur in a codeword $$d > E + 2t \quad (4)$$

For example, if $d=8$, and there are 1 erasure and 2 errors present, the decoded word will be corrected.

6. Burst Codes: Some codes are designed so that errors can be efficiently corrected if they occur randomly, while other codes are designed so that they can correct a burst, or cluster, of bits where each bit may be in error with high probability. Such codes are called burst correction codes and can correct bursts of length B bits provided that an error-free gap of G bits occurs between bursts. The Reiger bound states that $$G/B \geq \frac{1 + R}{1 - R} \quad (5)$$

The Reed-Solomon code is an example of a burst correcting code capable of correcting either errors or erasures.

7. Concatenation: Concatenation is encoding data using one code and then the encoded data again is encoded using a second code. A reason for using concatenation is that one code can correct random errors and when failing will generate a burst of errors which the second code can correct. A convolutional code frequently is concatenated with a Reed-Solomon code.

OBJECTS AND SUMMARY OF THE INVENTION

An object of the present invention is to provide a forward error correction (FEC) and detection code method and apparatus.

Another object of the present invention is to provide an FEC and detection code method and apparatus that is very efficient for burst error detection and correction.

A further object of the present invention is to provide an FEC and detection code for operating in an ARQ system using efficient code combining.

A still further object of the present invention is to provide an FEC and detection code capable of correcting errors and/or erasures.

A further object of the present invention is to provide an FEC and detection code method and apparatus that is easier to implement than many prior art codes.

An additional object of the present invention is to provide an FEC and detection code method and apparatus that is more powerful and less complex than many prior art codes.

According to the present invention, as embodied and broadly described herein, a Schilling-Manela encoding method is provided comprising the steps of storing a block of a data-symbol sequence in memory means having g rows by h columns of information-memory cells, calculating parity-check symbols from parity-line symbols having p-bits per symbol, along at least a first and a second set of parity lines. Each of the first set of parity lines can have a straight diagonal path with a first slope through the g rows by h columns of the information-memory cells and each of the second set of parity lines can have a straight diagonal path with a second slope through the g rows by h columns of the information-memory cells. Alternatively, each of the first and second set of parity lines can have curved paths through the g rows by h columns of the information-memory cells. The parity-check symbols are calculated by adding modulo-$2^p$ the parity-line symbols along each of the parity lines, respectively, and setting the parity-check symbol for each parity line equal to the modulo-$2^p$ sum of the parity-line symbols along each parity line. The parity-check symbols are stored in r parity-memory cells of the memory means, and an encoded-data-bit sequence is outputted comprising the data-bit sequence and the parity-check symbols.

The present invention also includes a Schilling-Manela decoding method comprising the steps of storing an encoded data-symbol sequence in memory means having at least g rows by h columns of information-memory cells and r parity-memory cells, wherein the encoded-data-symbol sequence includes a parity-check-symbol sequence having r parity-check symbols stored in the r parity-memory cells, and a data-symbol sequence blocked and stored in the g rows by h columns of information-memory cells. The parity-check symbols and the parity-line symbols along the parity lines in the g rows by h columns of information-memory cells, having an error, are found. The count of each composite cell on a composite-error graph traversed by the path of each of the parity lines having an error is incremented and the largest-number cell in the composite error graph having the largest number is determined. The largest number is compared to a threshold, and provided the largest number exceeds the threshold, a new-data symbol is determined for the memory cell in the information-memory cells corresponding to the largest-number cell in the composite error graph having the largest number. The new-data symbol is chosen to minimize the count in the largest-number cell, and the new-data symbol is substituted into the stored data-bit sequence.

The present invention further includes an apparatus for encoding and decoding a Schilling-Manela forward error correction and detection code. The apparatus for encoding a Schilling-Manela error correction code comprises memory means having g rows by h columns of information-memory cells and r parity-memory cells coupled to a data source for storing a block of a data-symbol sequence, and processor means coupled to the memory means for calculating parity-check symbols from parity-line symbols having p-bits per symbol, along a first and a second set of parity lines. Each of the first set of parity lines may have a straight diagonal path with a first slope through the g rows by h columns of the information-memory cells. Each of the second set of parity lines may have a straight diagonal path with a second slope through the g rows by h columns of the information-memory cells. Alternatively, each of the first and second set of parity lines can have curved paths through the g rows by h columns of the information-memory cells. The processor means may be embodied as a processor. The processor adds modulo-$2^p$ the parity-line symbols along each of the parity lines, respectively, and sets the parity-check symbol for each parity line equal to the modulo-$2^p$ sum of the parity-line symbols along each parity line, respectively. The processor stores the parity-check symbols in the r parity-memory cells of the memory means, and outputs an encoded data-symbol sequence comprising the data-symbol sequence and the parity-check symbols.

The apparatus for decoding a Schilling-Manela error correction code comprises memory means having at least g rows and h columns of information-memory cells and r parity-memory cells, coupled to a data source for storing a block of an encoded data-symbol sequence, a composite-error graph having g rows by h columns of composite cells, and processor means coupled to the memory means and composite-error graph for finding the parity-check symbols and the parity-line symbols along the parity lines in the g rows by h columns of information-memory cells, having an error. The encoded data-symbol sequence includes a parity-check-symbol sequence having r parity-check symbols stored in the r parity-memory cells and a data-symbol sequence having information-symbols stored in the g rows by h columns of the information-memory cells. The processor increments the count of each composite cell on the composite-error graph traversed by the path of each of the parity lines having an error, determines the largest-number cell in the composite-error graph having the largest number, and compares the largest number to a threshold. Provided the largest number exceeds the threshold, the processor determines a new-data symbol for the memory cell in the information-memory cells corresponding to the largest-number cell in the composite-error graph having the largest number. The new-data symbol minimizes the count in the largest-number cell, and the processor substitutes the new-data symbol into the stored data-symbol sequence. This process is repeated until the largest number found does not exceed the threshold, at which time the decoding process ceases.

Without departing from the spirit or scope of the present invention, the method and apparatus of the present invention may include having the data-symbol sequence blocked and stored in a λ-dimensional memory. In this more general case, there would be sufficient rows and columns to correspond to the λ-dimensional system. Further, parity-check symbols can be calculated from parity-line symbols along parity lines having curved paths passing through the λ-dimensional system.

Additional objects and advantages of the invention will be set forth in part in the description which follows, and in part will be obvious from the description, or may be learned by practice of the invention.

BRIEF DESCRIPTION OF THE DRAWINGS

The accompanying drawings, which are incorporated in and constitute a part of this specification, illustrate a preferred embodiment of the invention, and together with the description, serve to explain the principles of the invention.

FIG. 2A shows a g×h block of data in which the data was entered row by row;

FIG. 2B shows a g×h block of data in which the data was entered column by column;

FIG. 4A shows an encoded data block;

FIG. 4B illustrates a possible transmission by row;

FIG. 4C illustrates a received codeword with an error;

FIG. 4D shows a graph after all checks are made;

FIG. 4E illustrates a composite-error graph;

FIG. 5 shows a partially decoded word;

FIG. 6A shows a resulting composite-error graph;

FIG. 6B shows a resulting partially decoded word;

FIG. 7 shows a resulting composite-error graph;

FIG. 9A shows a code block of (g=6, h=10) gh=60 data bits;

FIG. 9B shows parity-check bits from a parity line that is vertical $(pc)_1$ and from a parity line that is at 45° $(pc)_2$;

FIG. 10 illustrates that when two parity lines are in error, their intersection indicates that the bit in row 3 and column 4 is in error and should be inverted;

FIG. 11A shows an encoded data block;

FIG. 11B illustrates a possible transmission by row;

FIG. 11C illustrates possible received bits with burst errors in the top row;

FIG. 11D illustrates the error graph and that when parity lines are all positive slope, the cell having the largest value in the lowest column and in the lowest number row is selected;

FIG. 11E illustrates a partially corrected bit pattern;

FIG. 11F illustrates the partially corrected error graph;

FIG. 11G and 11H illustrate additional corrections;

FIG. 12 illustrates that a simple erasure on bit location (2,4) can be corrected by the column four vertical parity line;

FIG. 13 illustrates that erasure along the diagonal can be corrected;

DETAILED DESCRIPTION OF THE PREFERRED EMBODIMENTS

Reference will now be made to the present preferred embodiments of the invention, examples of which are illustrated in the accompanying drawings.

Figure 1:
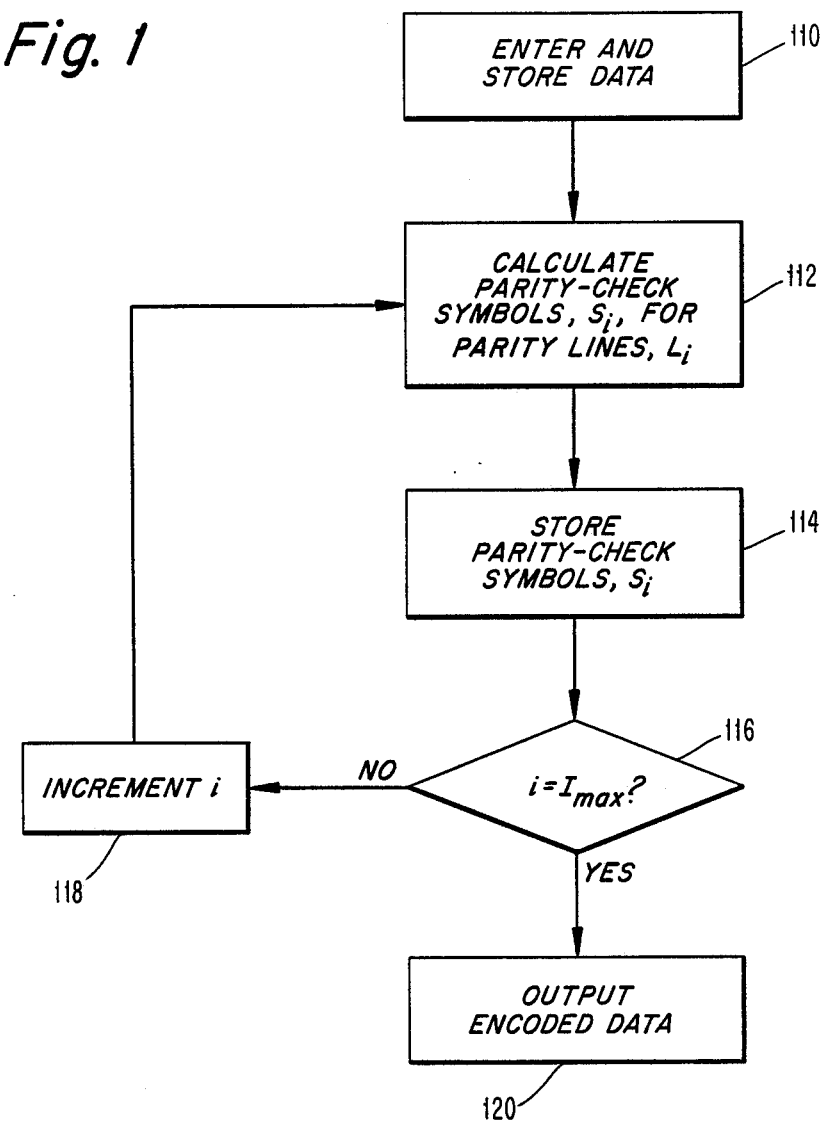
FIG. 1 shows a flow diagram of a Schilling-Manela encoding method according to a first embodiment of the present invention.

Referring to FIG. 1, a preferred embodiment of a Schilling-Manela error correcting and detecting code encoding method is shown comprising the steps of entering and storing 110 a block of a data-bit sequence in memory means having g rows by h columns of information-memory cells. The memory means may be embodied as a memory including a random access memory, or any other memory wherein data readily may be accessed. The memory may include r parity-memory cells for storing r parity symbols. The method includes calculating 112 parity-check symbols from parity-line symbols having p-bits per symbol. The plurality of parity-line symbols typically are along a plurality of parity paths. The parity paths may be parity lines, $L_i$. The parity-check symbols $S_i$ are stored 114 in the r parity-memory cells. The method determines 116 whether all the parity-check symbols, $I_{max}$, have been calculated, and outputs 120 an encoded-data-symbol sequence comprising the data-symbol sequence and the parity-check symbols. If all the parity-check symbols, $S_i$, have not been calculated, then the process increments 118 to the next parity line and calculates the next parity symbol, $S_{i+1}$.

In a first preferred embodiment of the encoding method according to the present invention, the parity-check symbols may be parity-check bits, and the parity-line symbols may be parity-line bits. In this first embodiment, the method may comprise calculating parity-check bits from parity-line bits, along a first and a second set of parity lines. Each of the first set of parity lines can have a straight diagonal path with a first slope through the g rows by h columns of the information-memory cells. Each of the second set of parity lines can have a straight diagonal path with a second slope through the g rows by h columns of the information memory cells. Alternatively, each of the first and second set of parity lines can have curved paths through the g rows by h columns of the information-memory cells. The parity-check bits are calculated by adding modulo 2 the parity-line bits along each of the parity lines, and setting the parity check bit for each parity line equal to the modulo 2 sum of the parity-line bits along each parity line, respectively. Accordingly, the parity-check bits are stored in the r parity-memory cells of the memory.

A second preferred embodiment of the Schilling-Manela error correcting and detecting encoding method using the flow chart of FIG. 1, includes entering the data to form a g row by h column data block in the information-memory cell. In an optimal mode, the parity-check bits are calculated by starting with the parity lines having either all positive or all negative slopes. The first parity line starts with the bit (1,1) and the last parity line includes bit (g,h). The slope i is then incremented and the process is repeated. If negative slope lines are used, then the same process is employed to calculate all parity check bits of each line of slope i. Now, however, the process starts with bit (1,h) and ends with bit (g,1). When $i=I_{max}$ the process is completed and all data bits and all parity check bits are transmitted. It is in the spirit of this invention that each parity line includes each bit (or symbol) and it is not important which order the parity lines are obtained.

The information data bits are first collected by the encoder to form a g row by h column block of data in the information memory cells, as shown in FIG. 2A and 2B. Note, that the data can be entered into the encoder row-by-row, as illustrated in FIG. 2A, or column-by-column, as illustrated in FIG. 2B. After the block of data is entered into the encoder, parity-check bits are added. To illustrate the algorithm for adding parity-check bits consider that the first h parity-check bits are obtained by modulo 2 adding a column of data-bits and setting the parity-check bit so that the parity-check bit is equal to the modulo 2 sum of the data bits. Thus, in FIG. 2B, for the $i^{th}$ column, the $i^{th}$ parity-check bit is $$r_i = \sum_{\substack{j=1 \\ \mathrm{mod}\ 2}}^{g} a_{ig+j} \quad (6)$$

where $i = 0, 1, 2, \ldots, h-1$

Let us further assume that the second set of parity-check bits are formed by modulo 2 adding the data bits along a 45° diagonal (slope=+1). Thus, in FIG. 2B, $$r_i = \sum_{\substack{j=1 \\ \mathrm{mod}\ 2}}^{g} a_{(i+j)g-(j-1)} \quad (7)$$

where $i = -g+1, \ldots, 0, 1, 2, \ldots, h-1$

According to the present invention, parity-check bits can be formed from different diagonals and the diagonals can have a positive or a negative slope. The spirit of the invention is that any selection of data bits, be it on a straight diagonal line or a curved line can be used to generate the parity check bits. Each such line is called a parity line.

Augmentation by Zeros

Referring to Equation 7, there are values of $$a_{(i+j)g-(j-1)} \quad (8)$$

which are non-existent. For example, consider $i = h-1$ and $j = 2$. In this case one has $a_{(h+1)g-1}$. Since $gh$ is the largest subscript possible, $a_{(h+1)g-1}$ is non-existent. Whenever such a non-existent data bit is required, it is assumed to be a 0-bit. Assuming such data bits to be a 1-bit does not alter the spirit of the present invention but merely its implementation. Conceptually, one can imagine that the data block shown in FIG. 2A and 2B has 0-bits in all columns to the left and to the right of the data block. These 0-bits are not transmitted and therefore do not affect the code rate.

Code Rate, R

The rate of the Schilling-Manela error correcting and detecting code is a function of the number of rows g, columns h, and the number and slope of parity lines, i.e., different sloped lines, w, used, where $w = r/h$. The code rate R is approximately given by $$R = \frac{g}{g+w} \quad (9)$$

Decoding Method

Figure 3:
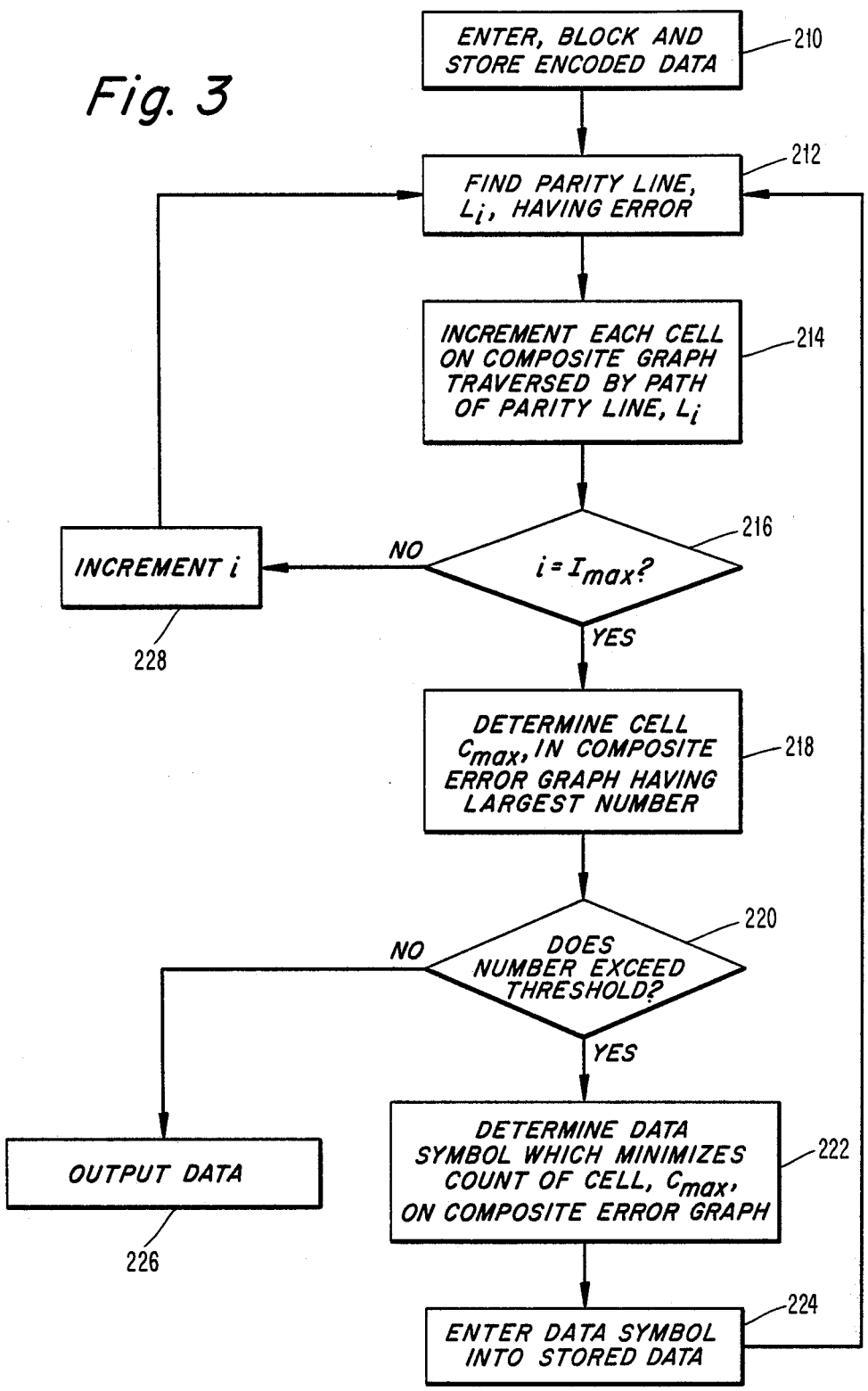
FIG. 3 shows a flow diagram of a first species of a Schilling-Manela decoding method according to the present invention.

According to the present invention a Schilling-Manela decoding method is provided. A first species of the Schilling-Manela decoding method according to the present invention, as illustrated in FIG. 3, includes the steps of entering, blocking and storing 210 an encoded-data-symbol sequence in memory means having at least g rows by h columns of information-memory cells, and r parity-memory cells with w parity lines. The memory means may be embodied as a memory including a random access memory, or any other memory wherein data readily may be accessed. The encoded-data-symbol sequence includes r parity-check symbols stored in the r parity-memory cells, and a data-symbol sequence blocked and stored in the g rows by h columns of the information-memory cells.

The first species of the Schilling-Manela decoding method includes finding 212 the parity-check symbols and the parity-line symbols along the parity lines $L_i$ in the g rows by h columns of the information memory cells, having an error. At the same time, the method uses a graph, and enters a 1-bit on each cell in the graph traversed by the path of each parity line $L_i$ having an error. At the end of generating a graph for each parity line $L_i$ having an error, the graphs generated from each parity line $L_i$ are added together to make a composite-error graph. Alternatively, the method can employ a composite-error graph directly, and increment 214 the count of each composite cell on the composite-error graph traversed by the path of each of the parity lines having an error.

The first species of the Schilling-Manela decoding method according to the present invention, determines 216 whether all the parity lines having an error have been entered onto the composite-error graph, and determines 218 the largest-number cell in the composite-error graph having the largest number. Accordingly, the largest number is compared 220 to a threshold and, provided the largest number exceeds the threshold, a new-data symbol for the memory cell in the information-memory cells which corresponds to the largest number cell in the composite-error graph having the largest number, is determined 222. For optimum performance of burst error correction, the threshold might be set to be greater than or equal to w/2. For optimum performance of random error correction, the thresholds might be set to be greater than or equal to w/2+1. The new-data symbol is chosen so as to minimize the cell count in the largest number cell on the composite-error graph. The new-data symbol is substituted into the information-memory cells. In the event the largest number does not exceed the threshold, then the Schilling-Manela decoding method outputs 226 the data.

To illustrate the first species of the Schilling-Manela decoding method, consider the encoded data block as shown in FIG. 4A which may be transmitted by row as shown in FIG. 4B. Note that the code rate is $$R = \frac{18}{18 + 6 + 8 + 8} = 0.45$$

The received codeword with errors is shown in FIG. 4C. In this particular embodiment of the first species of the Schilling-Manela decoding method, the parity-check symbols are parity-check bits and the parity-line symbols are parity-line bits. The modulo 2 sum of each and every parity line is computed for each slope. In this example, there are six vertical parity lines, eight 45° parity lines and eight −45° parity lines. If any parity line is in error a 1-bit is entered in the cells traversed by the path of the parity line, of a graph. If the parity line is not in error a 0-bit is entered in the cells traversed by the path of the parity line, of a graph. FIG. 4D shows the graphs after a vertical check, a +45° check and a −45° check was taken. Note that the vertical check "sees" a error in columns 3 and 5, and that 2 diagonals indicate errors in the +45° diagonal check and that 2 diagonals indicate errors in the −45° diagonal check.

A composite-error graph, shown in FIG. 4E, is formed. The graph includes composite cells showing the sum of the errors. The maximum number in a composite cell is equal to the number of parity check rows employed. A typical threshold might be T−1, indicating that peak values of 2 or 3 are used as error indicators. To correct an error each cell is searched to find the largest number on the composite-error graph. If only a single composite cell contains this largest number, then the bit in that row and column is inverted and the procedure is repeated. In FIG. 4E row 2, column 3, is selected and that bit, (2,3) is inverted. The process is repeated using the partially decoded word shown in FIG. 5.

Proceeding as above, the next composite map is as shown in FIG. 6A and the next partial decoding is shown in FIG. 6B. FIG. 7 shows that all errors have been corrected.

If erasures and error are present simultaneously in a received data block then each erasure is first replaced by a 1 and then by a 0. In each case each cell in the composite-error graph receives a number denoting the number of parity check lines containing errors caused by each selection for the erasures. The bit selection chosen is the one which minimizes the number in the cell containing the erasure. Then, the standard error correction is performed.

Figure 8:
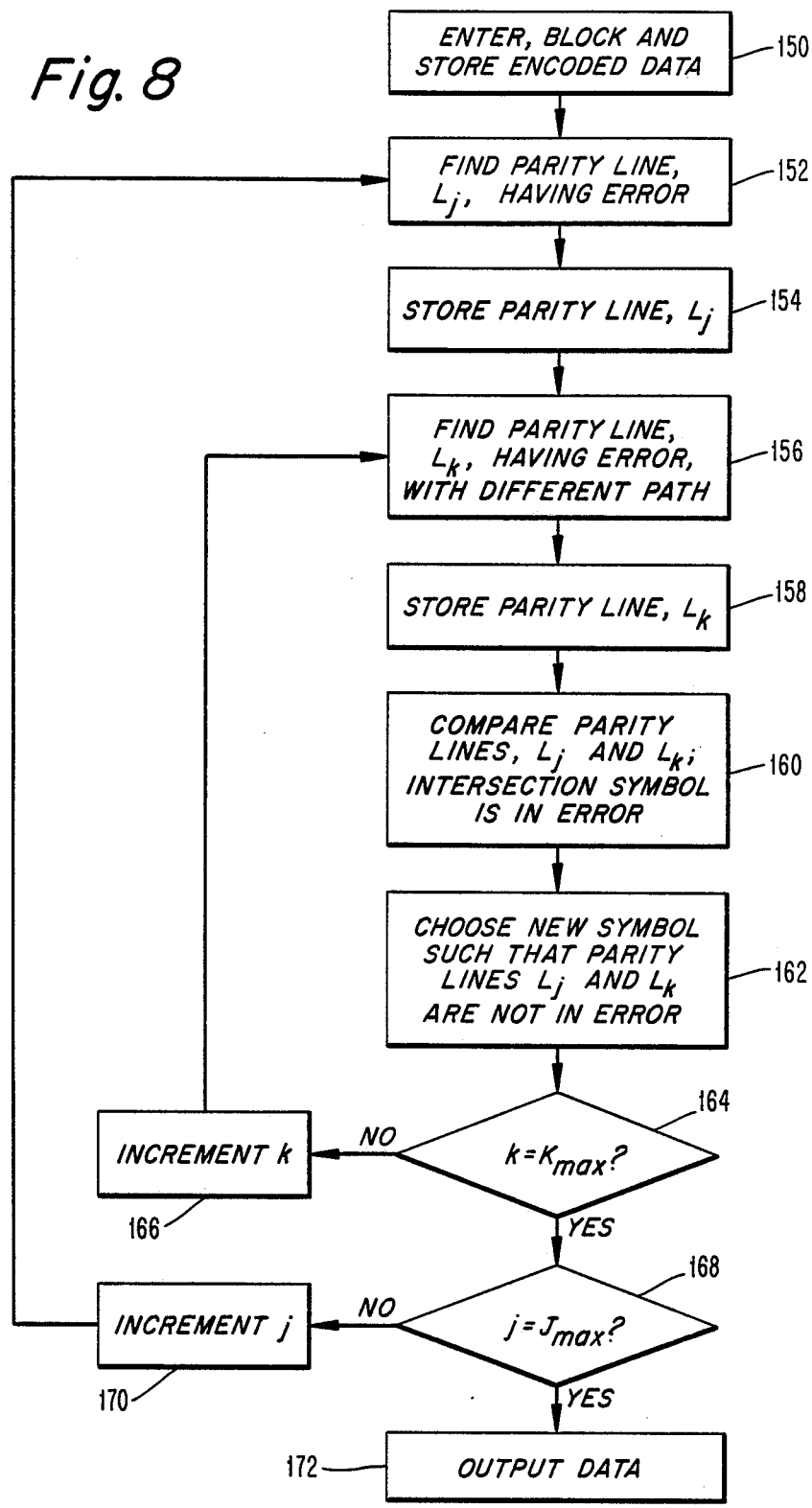
FIG. 8 shows a flow diagram of a second species of a Schilling-Manela decoding method according to the present invention.

A second species of the Schilling-Manela decoding method according to the present invention, as illustrated in FIG. 8, includes the steps of entering, storing and blocking 150 an encoded-data-symbol sequence in memory means having at least g rows by h columns of information-memory cells and r parity-memory cells. The encoded-data-symbol sequence includes a parity-check-symbol sequence having r parity-check symbols stored in the r parity-memory cells, and a data-symbol sequence having gh information symbols blocked and stored in the g rows by h columns of information-memory cells. The method includes finding 152 the parity-check symbol and parity-line symbols along a first parity line, $L_j$, in the g rows by h columns of information memory cells, having an error, storing parity line, $L_j$, and finding 156 the parity-check symbol and parity-line symbols along a second parity line, $L_k$, in the g rows by h columns of information memory cells, having an error. The steps further include comparing 160 the parity-check symbols and parity-line symbols along the first and second parity lines, respectively, for determining the parity-line symbol having an error, and substituting 162 a new-parity-line symbol for the parity-line symbol having an error so that first and second parity lines are not in error. The decoding method determines 164, 168 whether all parity lines having an error have been processed, and increments 166, 170 to a next parity line if they have not all been processed. If all the parity lines have been compared, then the corrected data-bit sequence is outputted 172.

To illustrate a particular preferred embodiment of the second species of the Schilling-Manela decoding method according to the present invention, consider the input data-bit sequence being blocked and stored as a code block having g=6 rows and h=10 columns, shown in FIG. 9A.

The encoded data sequence is shown in FIG. 9B. The received encoded-data bits have errors or erasures. Referring to FIG. 10, each positive slope (45°) parity line is checked until a line is found which indicates errors and which has the left most footprint. The footprint is defined as the bit occurring in row g at the most left hand column. A second line of different (vertical) slope having the next earliest footprint is selected. The intersection of these two lines is the bit which is in error. This bit is inverted. Each parity line is rechecked, since correcting an error will alter the error status of some of the parity lines. This process is continued both from the left (positive sloped lines) and then from the right (negative sloped lines) until there are no bit changes occurring in a cycle. If there are still parity lines in error, the errors exist but cannot be corrected. For example, if there were two errors in the parity-check bits, one in row 1, column 6, and the other in row 8, column 8, then an error would be created in cell (3,8).

To illustrate the burst error correction capability of the Schilling-Manela encoder and decoder consider the data block and parity-check bits shown in FIG. 11A. Note that for optimal performance all parity lines must be in the same direction and should be interleaved with data rows. These bits are transmitted, row by row as shown in FIG. 11B. Interleaving is not shown in this example. There are 18 information bits, 18 parity check bits and therefore 36 transmitted bits. Thus the code rate is R=18/36=0.5.

FIG. 11C shows that the bits are received with row one in error.

FIG. 11D shows a composite-error graph indicating a burst of errors. The procedure is to select the bit in row 1, column 1, for inversion when the parity lines are positive.

FIG. 11E shows the partially decoded word and FIG. 11F shows the resulting error graph. Next invert the bit adjacent to the 0 providing the threshold is exceeded. In this case T=1. FIG. 11G shows the partially decoded word and 11H indicates the cell exceeding the threshold adjacent to the 0. This procedure continues until the maximum number in a cell is less than the threshold. For this example, the process continues until the number in the cells decreases below 2. In general, if there are w parity lines, then w/2−1 is the desired threshold. If w=2, then the threshold is w/2.

Note, that in general, all combinations can be attempted, and the combination resulting in a minimized cell count, chosen.

Operation of the SM Code

To illustrate the operation of the Schilling-Manela error correcting and detecting code, consider the rate R=0.7 code shown in FIG. 9A and 9B. FIG. 9B shows the parity check bits (pc), formed from the 45° parity lines. Note that $(pc)_2$ contains $h+(g-1)$ bits in order that a $(pc)_2$ bit be generated for each and every 45° line. The data bits and the parity check bits are now transmitted row by row. Such transmission is required for error decoding.

If any bit is received in error, two parity check lines, one from the (pc)₁ lines and one from the (pc)₂ lines will not add to 0. Their intersection is the bit which is in error. If a burst of errors occurs such that the probability of an error in any bit in the sequence is $P_{ii}$ then the vertical parity lines will denote errors. Starting with the diagonal parity line on the left and moving toward the right the parity lines with errors, one-by-one, are check for intersections.

For example, the data stream shown in FIG. 9B is received as shown in FIG. 10. Note that a vertical and a horizontal parity line indicate an error. Thus the bit which is common to both lines is assumed to be in error and is inverted in the decoder.

Erasure Decoding

If, in FIG. 10, bit (2,4) were erased then either the vertical parity line or diagonal parity line containing this bit could be used to determine the correct bit. This conclusion is made apparent by referring to FIG. 12. Since there are an odd number of 1-bis in column 4, and even parity has been assumed (odd parity could also be used) the (2,4) bit must be a 1-bit.

However, the power of erasure decoding occurs in the erasure pattern shown in FIG. 13. Note that by using the vertical parity line of column 4, the erasure at bit (3,4) is set equal to 1. Then the erasure at (2,5) is corrected by using the diagonal parity line d to set bit (2,5) equal to 0. Finally, either the vertical parity line of column 5 or the diagonal parity line e can be used to set bit (3,5) equal to 1.

Alternate Parity Lines

The use of additional diagonal parity lines of either positive or negative shape serves to increase the power of the code. In a particular embodiment, 45° diagonal (slope 1/1=1), vertical and −45° diagonal (slope=−1) parity lines have been used. Also, the number of parity lines can be increased to 4 and to 5 by adding parity lines of slope $\pm \frac{1}{2}$.

Using negative parity lines the decoding method can be from left-to-right and also from right-to-left.

Further, since intersections having errors are being searched, such intersections can be calculated in parallel and not necessarily restricted to a sequential search which was described above decoding algorithms, of which there are many, can use this information.

Concatenation

The Schilling-Manela error correcting and detecting code can be concatenated with any other code. One preferred approach is to form a codeword using each row or by using each column. However, diagonal codewords can also be used.

For example, if the Schilling-Manela error correcting and detecting code is constructed using rows containing m=11 bits, then by adding the appropriate 5 additional bits to each row forms an extended Hamming code on each row. The Hamming code can correct a single error per row and detect up to 4 errors.

In such a receiver, the Hamming code is first decoded. The resulting Schilling-Manela error correcting and detecting code encoded word now has been partially corrected and where not corrected we know, with high probability, in which rows errors exist.

Schilling-Manela Encoding and Decoding Apparatus

Figure 14A:
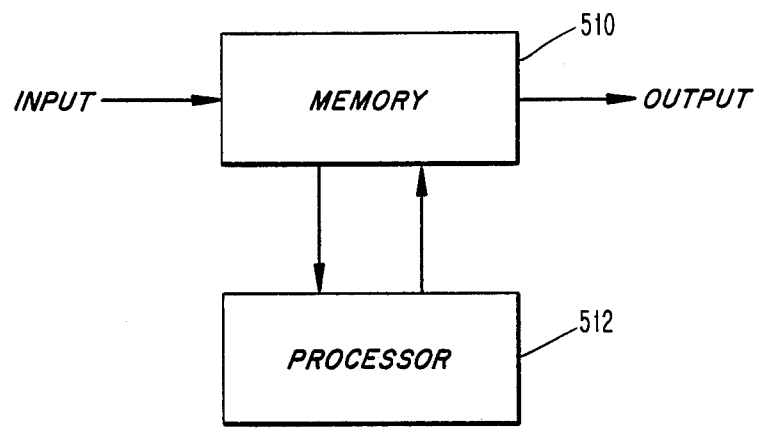
FIG. 14A and 14B show block diagrams of Schilling-Manela encoding and decoding apparatus according to the present invention.

The present invention further includes an apparatus for encoding and decoding a Schilling-Manela error correction code. The apparatus for encoding a Schilling-Manela error correction code, as illustrated in FIG. 14A, comprises memory means having g rows by h columns of information-memory cells and r parity-memory cells coupled to a data source for storing a block of a data-bit sequence, and processor means coupled to the memory means for calculating parity-check symbols from parity-line symbols having p-bits per symbol, along a first and a second set of parity lines. The memory means may be embodied as memory 510 and processor means may be embodied as processor 512.

In the memory, each of the first set of parity lines may have a straight diagonal path with a first slope through the g rows by h columns of the information-memory cells. Each of the second set of parity lines may have a straight diagonal path with second slope through the g rows by h columns of the information-memory cells. The processor 512 adds, modulo-$2^p$, the parity-line symbols along each of the parity lines, respectively, and sets the parity-check symbol for each parity line equal to the modulo-$2^p$ sum of the parity-line symbols along each parity line, respectively. The processor 512 stores the parity-check symbols in the r parity-memory cells of the memory 510, and outputs an encoded-data-bit sequence comprising the data-bit sequence and the parity-check symbols.

Figure 14B:
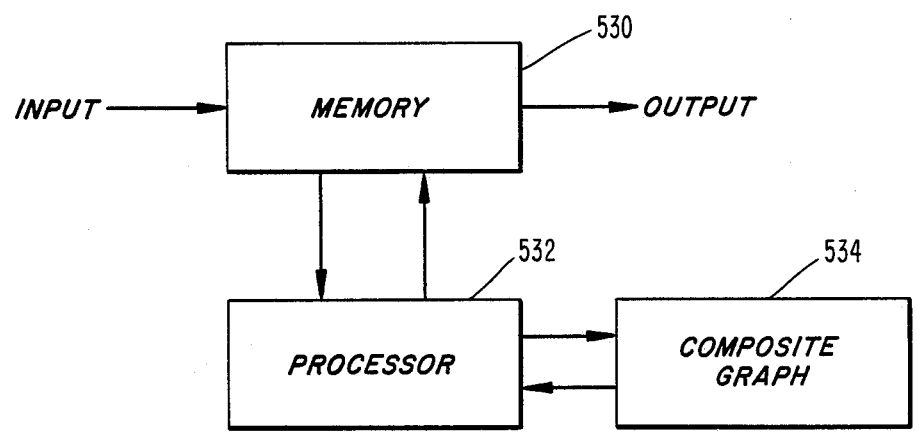

The apparatus for decoding a Schilling-Manela error correction code, as shown in FIG. 14B, comprises memory means having at least g rows and h columns of information-memory cells and r parity-memory cells, coupled to a data source for storing a block of an encoded-data-symbol sequence, a composite-error graph 534 having g rows by h columns of composite cells, and processor means coupled to the memory means and composite-error graph 534 for finding the parity-check symbols and the parity-line symbols along the parity lines in the g rows by h columns of information-memory cells, having an error. The processor means may be embodied as processor 532 and memory means may be embodied as memory 530. The encoded-data-symbol sequence includes a parity-check-symbol sequence having r parity-check symbols stored in the r parity-memory cells and a data-symbol sequence having information-symbols stored in the g rows by h columns of the information-memory cells. The processor 532 increments the count of each composite cell on the composite-error graph traversed by the path of each of the parity lines having an error, determines the largest-number cell in the composite-error graph 534 having the largest number, and compares the largest number to a threshold. Provided the largest number exceeds the threshold, the processor 532 determines a new-data symbol for the memory cell in the information-memory cells corresponding to the largest-number cell in the composite-error graph having the largest number. The new-data symbol minimizes the count in the largest-number cell, and the processor 532 substitutes the new-data symbol into the stored data-bit sequence.

Encoding in an ARQ System

Figure 15:
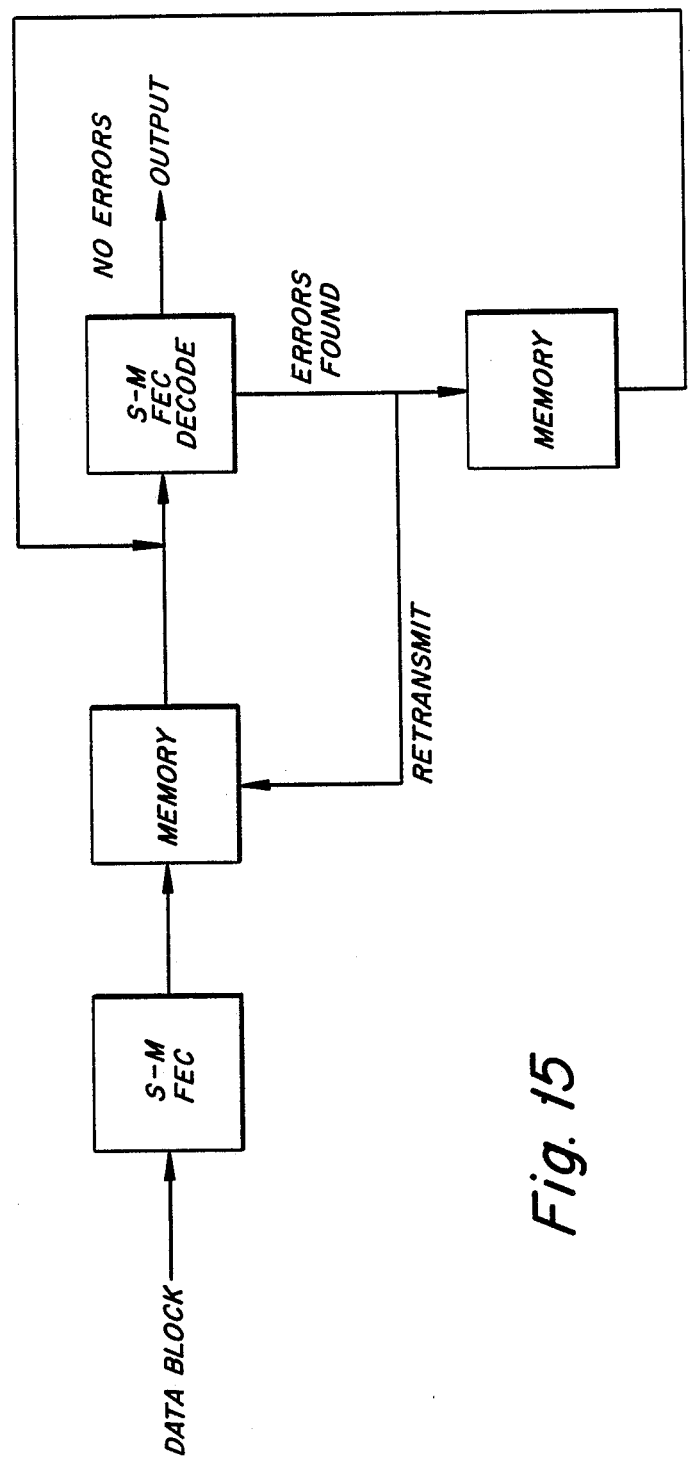
FIG. 15 shows how the Schilling-Manela FEC and detection code can be used in an Automatic Repeat Request System.

Consider communicating using the Schilling-Manela error correcting and detecting code when a feedback channel is available as shown in FIG. 15. If errors are detected and are too numerous to be corrected, the feedback channel is used to notify the encoder. The encoder then sends one or more additional rows of parity check bits which significantly increases the power of the code.

In any ARQ system the probability of an undetected error is of extreme importance. Here, if each parity line checks the data only, then the probability of an undetected error, $P_{und}$, is $$P_{und} \alpha p^{w+1}$$

where p is the probability of a bit being in error and w is the number of different sloped parity lines. If each sloped line checks all data and the previously evaluated parity lines, then $P_{und}$ decreases dramatically.

Using this system, the average code rate remains high and only those messages which were initially received incorrectly, need have additional parity check bits sent.

In this system a block of data $D_1$ is encoded with w parity lines. For example, let w=12. The block of data $D_1$ is transmitted with $w_{11}<w$ parity lines. For example, let $w_{11}=4$. At the receiver, error correction occurs. If the errors are all corrected, the data is outputted. If some errors are not correctable, the received data block $D_1$ and the associated $w_1$ parity lines are stored. A retransmit request is returned to the sender.

Depending on system delays a data block $D_2$ is sent with $w_{22}$ parity lines and $w_{21}$ parity lines which came from block of data $D_1$ and which was stored in memory. If $w_{11}=4$ and $w_{21}=4$, then at the receiver the FEC code decodes data block $D_1$ and again decodes data block $D_1$ now using $w_{11}+w_{21}$ parity lines. For example, if $w_{11}=4$, then the probability of a bit error in $D_1$ after the first decoding is of the order $p_1 \alpha p^2$, while since $w_{11}+w_{21}=8$, the probability of a bit error in $D_2$ after the second decoding is $p_2 \alpha p^4$.

This technique is more efficient than other ARQ systems since only a new set of parity-check bits are retransmitted, while other techniques retransmit the entire data block. Also, the power of the code increases as the sum of the number of parity lines received. Other codes do not have this capability.

ARO CALCULATIONS $$T = (mk\, T_b + mw_1\, T_b)\, p^{w1/2} + mw_2\, T_b\, (1 - p^{w1/2}) p^{(w1+w2)/2} + \qquad (10)$$

$$mw_3\, T_b\, (1 - p^{w1/2})(1 - p^{(w1+w2)/2}) \cdot p^{(w1+w2+w3)/2}$$

If one lets $w_1 = w_2 = w_3 = \ldots$, then $$\frac{T}{mT_b} = (k + w_1)\, p^{w1/2} + w_1(1 - p^{w1/2})\, p^{2w1/2} + \qquad (11)$$

$$\cdot \quad w_1(1 - p^{w1/2})(1 - p^{w1})\, p^{3w1/2} + \ldots$$

Letting $p^{w1/2} = x$, then $$\frac{T}{mT_b} = (k + w_1 x + w_1(1 - x)x^2 + \qquad (12)$$

$$w_1(1 - x)(1 - x^2)\, x^3 + w_1(1 - x)(1 - x^2)(1 - x^3)\, x^4 + \ldots$$

For $x << 1$, then $$\frac{T}{mT_b} = (k)x + w_1[x + x^2 + x^3 + x^4 + x^5 + \ldots] \qquad (13)$$

-continued
$$T = m(k + w_1)T_p^{w1/2} + mw_1 T_b(1 - p^{w1/2}) p^{w1}$$

with an increase in delay (thruput)

The increase in thruput is negligible.

The encoder apparatus and procedures described above used parity check lines to modulo-$2^p$ sum the data symbols along each parity line. It is within the spirit of this invention to have an encoding procedure for summing data symbols along parity lines having a first slope, then sum the data symbols and the first parity-check symbols along parity lines having a second slope, sum data symbols and the first and second parity line check symbols along parity lines having a third slope, etc. The first, second, third, . . . , $w^{th}$ slopes can be chosen arbitrarily. The decoding method and apparatus for this extension of encoding remains unchanged.

The invention described above is a special case of a 2-dimensional array. It is within the spirit of the present invention that a 3-dimensional array of data symbols can be formed and parity check symbols obtained in the encoder. The decoder method and apparatus would operate the same as described above. Further, it is within the spirit of the present invention that a $\lambda$-dimensional array of data symbols be formed and the same encoding and decoding procedures be employed. In this more general case, there would be sufficient rows and columns to correspond to the $\lambda$-dimensional system. Further, parity-check symbols can be calculated from parity-line symbols along parity lines having curved paths passing through the $\lambda$-dimensional system.

The Schilling-Manela code is a very efficient burst detecting and correcting code. It meets the Reiger bound. However, the Schilling-Manela error correcting and detecting code can correct, more random errors per codeword than the Reed-Solomon code and is easier to implement. Thus, the Schilling-Manela error correcting and detecting code is more powerful and less complex than the other competitive code.

It will be apparent to those skilled in the art that various modifications can be made to the Schilling-Manela forward error correction and detection code method and apparatus of the instant invention without departing from the scope or spirit of the invention, and it is intended that the present invention cover modifications and variations of the Schilling-Manela forward error correction and detection code method and apparatus provided they come within the scope of the appended claims and their equivalents.

We claim:

1. A process for encoding a Schilling-Manela error correcting and detecting code comprising the steps of:
   storing a block of a data-symbol sequence in memory means having g rows by h columns of information-memory cells;
   calculating parity-check symbols from parity-line symbols having p-bits per symbol, along a first and a second set of parity lines, each of the first set of parity lines having a straight diagonal path with a first slope through the g rows by h columns of said information-memory cells and each of the second set of parity lines having a straight diagonal path with a second slope through the g rows by h columns of said information-memory cells, by adding modulo-$2^p$ the parity-line symbols along each of the parity lines, respectively;

setting the parity-check symbol for each parity line equal to the modulo-$2^p$ sum of the parity-line symbols along each parity line, respectively;

storing the parity-check symbols in r parity-memory cells of said memory means, and outputting an encoded-data-symbol sequence comprising the data-symbol sequence and the parity-check symbols.

2. A process for encoding a Schilling-Manela error correcting and detecting code comprising the steps of:

storing a block of a data-symbol sequence in memory means having at least g rows by h columns of information-memory cells;

calculating parity-check symbols from parity-line symbols having p bits per symbol, along at least two parity paths having different slopes in the g rows by h columns of said information-memory cells by adding modulo-$2^p$ the parity-line symbols along each of the parity paths; and setting the parity-check symbol for each parity path equal to the modulo-$2^p$ sum of the parity-line symbols along each of the parity paths, respectively.

3. The process for encoding the Schilling-Manela error correcting code as set forth in claim 1 or 2, wherein the steps of:

calculating parity-check symbols from parity-line symbols includes calculating parity-check symbols from data symbols; and setting parity-check symbols for each parity line equal to the modulo-$2^p$ sum of the parity-line symbols includes setting the parity-check symbols for each parity line equal to the modulo 2 sum of the data symbols.

4. A process for encoding a Schilling-Manela error correcting and detecting code comprising the steps of:

storing a block of a data-bit sequence in memory means having g rows by h columns of information-memory cells;

calculating parity-check bits from parity-line bits, along at least a first and a second set of parity lines, each of the first set of parity lines having a straight diagonal path with a first slope through the g rows by h columns of said information-memory cells and each of the second set of parity lines having a straight diagonal path with a second slope through the g rows by h columns of said information-memory cells, by adding modulo 2 the parity-line bits along each of the parity lines, respectively;

setting the parity-check bit for each parity line equal to the modulo 2 sum of the parity-line bits along each parity line, respectively;

storing the parity-check bits in r parity-memory cells of said memory means, and outputting an encoded data-bit sequence comprising the data bit sequence and the parity-check bits.

5. A process for decoding a Schilling-Manela error correcting and detecting code comprising the steps of:

storing an encoded-data-bit sequence in memory means having at least g rows by h columns of information-memory cells and r parity-memory cells, wherein said encoded-data-symbol sequence includes a parity-check-symbol sequence having r parity-check symbols stored in the r parity-memory cells, and a data-symbol sequence blocked and stored in the g rows by h columns of information-memory cells;

finding the parity-check symbols and the parity-line symbols along the parity lines in the g rows by h columns of information-memory cells, having an error;

incrementing the count of each composite cell on a composite-error graph traversed by the path of each of the parity lines having an error;

determining the largest-number cell in the composite-error graph having the largest number;

comparing the largest number to a threshold;

determining, provided the largest number exceeds the threshold, a new-data symbol for the memory cell in the information-memory cells corresponding to the largest-number cell in the composite-error graph having the largest number, wherein the new-data symbol minimizes the count in the largest-number cell; and substituting the new-data symbol into the stored data-symbol sequence.

6. A process for decoding a Schilling-Manela error correcting and detecting code comprising the steps of:

storing an encoded-data-bit sequence in memory means having at least g rows by h columns of information-memory cells and r parity-memory cells, wherein said encoded-data-bit sequence includes a parity-check-bit sequence having r parity-check bits stored in the r parity-memory cells, and a data-bit sequence blocked and stored in the g rows by h columns of information-memory cells;

finding the parity-check bits and the parity-line bits along the parity lines in the g rows by h columns of information-memory cells, having an error;

incrementing the count of each composite cell on a composite-error graph traversed by the path of each of the parity lines having an error;

determining the largest-number cell in the composite-error graph having the largest number;

comparing the largest number to a threshold; and inverting, provided the largest number exceeds, the threshold, the data symbol in the information-memory cells corresponding to the largest-number cell in the composite-error graph having the largest number, thereby the new-data symbol minimizes the count in the largest-number cell.

7. The process for decoding a Schilling-Manela error correcting and detecting code as set forth in claim 6, further comprising the steps of:

repeating the steps of finding the parity-check bits and the parity-line bits along the parity lines in the g rows by h columns of information-memory cells, having an error;

incrementing the count of each composite cell on a composite-error graph traversed by the path of each of the parity lines having an error;

determining the largest-number cell in the composite-error graph having the largest number;

comparing the largest number to a threshold;

inverting, provided the largest number exceeds the threshold, the data bit in the information-memory cells corresponding to the largest-number cell in the composite-error graph having the largest number, thereby the new-data symbol minimizes the count in the largest-number cell;

until the largest number does not exceed the threshold, thereby determining all of the composite cells exceeding a threshold, and testing one at a time by inverting the bit in that composite cell exceeding the threshold and determining a new composite-error graph for each subsequent cell inversion.

8. A process for decoding a Schilling-Manela error correcting and detecting code comprising the steps of:

storing an encoded-data-bit sequence in memory means having at least g rows by h columns of information-memory cells and r parity-memory cells, wherein said encoded-data-bit sequence includes a parity-check-bit sequence having r parity-check bits stored in the r parity-memory cells, and a data-bit sequence blocked and stored in the g rows by h columns of information-memory cells;

finding the parity-check bit and the parity-line bits along a first parity line in the g rows by h columns of information memory cells, having an error;

finding the parity-check bit and the parity-line bits along a second parity line in the g rows by h columns of information memory cells, having an error;

inverting the data bit at the intersection of the first and second parity lines; and outputting the corrected data-bit sequence.

9. A process for decoding a Schilling-Manela error correcting and detecting code comprising the steps of:

storing an encoded-data-symbol sequence in memory means having at least g rows by h columns of information-memory cells and r parity-memory cells, wherein said encoded-data-symbol sequence includes a parity-check-symbol sequence having r parity-check symbols stored in the r parity-memory cells, and a data-symbol sequence having information symbols blocked and stored in the g rows by h columns of information-memory cells;

finding the parity-check symbol and parity-line symbols along a first parity line in the g rows by h columns of information memory cells, having an error;

finding the parity-check symbol and parity-line symbols along a second parity line in the g rows by h columns of information memory cells, having an error;

comparing the parity-check symbols and parity-line symbols along the first and second parity lines, respectively, for determining the parity-line symbol having an error;

substituting a new-parity-line symbol for the parity-line symbol having an error so that first and second parity lines are not in error; and outputting the corrected data-symbol sequence.

10. A Schilling-Manela error correcting and detecting code encoding apparatus comprising:

memory means having g rows by h columns of information-memory cells and r parity-memory cells coupled to a data source for storing a block of a data-symbol sequence; and processor means coupled to said memory means for calculating parity-check symbols from parity-line symbols having p-bits per symbol, along a first and a second set of parity lines, each of the first set of parity lines having a straight diagonal path with a first slope through the g rows by h columns of said information-memory cells and each of the second set of parity lines having a straight diagonal path with a second slope through the g rows by h columns of said information-memory cells, by adding modulo-$2^p$ the parity-line symbols along each of the parity lines, respectively, and setting the parity-check symbol for each parity line equal to the modulo-$2^p$ sum of the parity-line symbols along each parity line, respectively, and storing the parity-check symbols in the r parity-memory cells of said memory means, and outputting an encoded-data-symbol sequence comprising the data-symbol sequence and the parity-check symbols.

11. A Schilling-Manela error correcting and detecting code encoding apparatus comprising:

memory means having g rows by h columns of information-memory cells and r parity-memory cells coupled to a data source for storing a block of a data-symbol sequence; and processor means coupled to said memory means for calculating a plurality of parity-check symbols from parity-line symbols having p bits per symbol, along a plurality of parity paths in the g rows by h columns of said information-memory cells by adding modulo-$2^p$ the parity-line symbols along each of the parity paths, and setting the parity-check symbol for each parity path equal to the modulo-$2^p$ sum of the parity-line symbols along each of the parity paths, respectively.

12. A Schilling-Manela error correcting and detecting code encoding apparatus comprising:

memory means having g rows by h columns of information-memory cells and r parity-memory cells coupled to a data source for storing a block of a data-bit sequence; and processor means coupled to said memory means for calculating parity-check bits from parity-line bits, along a first and a second set of parity lines, each of the first set of parity lines having a path with a first slope through the g rows by h columns of said information-memory cells and each of the second set of parity lines having a path with a second slope through the g rows by h columns of said information-memory cells, by adding modulo 2 the parity-line bits along each of the parity lines, respectively, setting the parity-check bit for each parity line equal to the modulo 2 sum of the parity-line bits along each parity line, respectively, storing the parity-check bits in r parity-memory cells of said memory means, and outputting an encoded data-bit sequence comprising the data bit sequence and the parity-check bits.

13. The Schilling-Manela encoding apparatus as set forth in claim 10 or 12 wherein said processor means calculates parity-check bits along the first set of parity lines having the first diagonal path with a 45° slope and along the second set of parity lines having the second diagonal path with a −45° slope.

14. The Schilling-Manela encoding apparatus as set forth in claim 11 wherein said processor means further includes calculating parity-check bits from data bits along a plurality of independently sloped parity lines in which the slopes may be all positive, all negative or employ some positive and some negative slopes.

15. A Schilling-Manela decoding apparatus comprising:

memory means having at least g rows and h columns of information-memory cells and r parity-memory cells, coupled to a data source for storing a block of an encoded-data-symbol sequence, wherein said encoded-data-symbol sequence includes a parity-check-symbol sequence having r parity-check bits stored in the r parity-memory cells and a data-symbol sequence having information symbols stored in the g rows by h columns of said information-memory cells;

a composite-error graph having g rows by h columns of composite cells; and processor means coupled to said memory means and said composite-error graph for finding the parity-check symbols and the parity-line symbols along the parity lines in the g rows by h columns of information-memory cells, having an error, incrementing the count of each composite cell on the composite-error graph traversed by the path of each of the parity lines having an error, determining the largest-number cell in the composite-error graph having the largest number, comparing the largest number to a threshold, determining, provided the largest number exceeds the threshold, a new-data symbol for the memory cell in the information-memory cells corresponding to the largest-number cell in the composite-error graph having the largest number, wherein the new-data symbol minimizes the count in the largest-number cell, and substituting the new-data symbol into the information-memory cells.

16. A Schilling-Manela decoding apparatus comprising:

memory means having at least g rows and h columns of information-memory cells and r parity-memory cells, coupled to a data source for storing a block of an encoded-data-bit sequence, wherein said encoded-data-bit sequence includes a parity-check-bit sequence having r parity-check bits stored in the r parity-memory cells and a data-bit sequence having information bits stored in the g rows by h columns of said information-memory cells;

a composite-error graph having g rows by h columns of composite cells; and processor means coupled to said memory means and said composite-error graph for finding the parity-check bits and the parity-line bits along the parity lines in the g rows by h columns of information-memory cells, having an error, incrementing the count of each composite cell on a composite-error graph traversed by the path of each of the parity lines having an error, determining the largest-number cell in the composite-error graph having the largest number, comparing the largest number to a threshold, and inverting, provided the largest number exceeds the threshold, the data bit in the information-memory cells corresponding to the largest-number cell in the composite-error graph having the largest number, thereby the new-data symbol minimizes the count in the largest-number cell.

17. A Schilling-Manela decoding apparatus comprising:

memory means having at least g rows and h columns of information-memory cells and r parity-memory cells, coupled to a data source for storing a block of an encoded-data-bit sequence, wherein said encoded-data-bit sequence includes a parity-check-bit sequence having r parity-check bits stored in the r parity-memory cells and a data-bit sequence having information bits stored in the g rows by h columns of said information-memory cells;

a composite-error graph having g rows by h columns of composite cells; and processor means coupled to said memory means and said composite-error graph for finding the parity-check bit and the parity-line bits along a first parity line in the g rows by h columns of information memory cells, having an error, finding the parity-check bit and the parity-line bits along a second parity line in the g rows by h columns of information memory cells, having an error, inverting the data bit at the intersection of the first and second parity lines, and outputting the corrected data-bit sequence.

18. A process for communicating in an ARQ system with the Schilling-Manela FEC and detection code comprising the steps of:

storing a block of a data-symbol sequence in transmit-memory means having at least g rows by h columns of information-memory cells;

calculating parity-check symbols from parity-line symbols having p bits per symbol, along at least two parity paths having different slopes in the g rows by h columns of said information-memory cells by adding modulo-$2^p$ the parity-line symbols along each of the parity paths;

setting the parity-check symbol for each parity path equal to the modulo-$2^p$ sum of the parity-line symbols along each of the parity paths, respectively;

transmitting an encoded-data-symbol sequence over a communications channel having a feedback channel, wherein said encoded-data-symbol sequence includes the parity-check-symbol sequence and the data-symbol sequence;

storing the encoded-data-symbol sequence in receiver-memory means having at least g rows by h columns of information-memory cells and r parity-memory cells, wherein said encoded-data-symbol sequence includes a parity-check-symbol sequence having r parity-check symbols stored in the r parity-memory cells, and a data-symbol sequence blocked and stored in the g rows by h columns of information-memory cells; finding the parity-check bits and the parity-line bits along the parity lines in the g rows by h columns of information-memory cells, having an error;

incrementing the count of each composite cell on a composite-error graph traversed by the path of each of the parity lines having an error;

determining the largest-number cell in the composite-error graph having the largest number;

comparing the largest number to a threshold;

inverting, provided the largest number exceeds the threshold, the data bit in the information-memory cells corresponding to the largest-number cell in the composite-error graph having the largest number, thereby the new-data symbol minimizes the count in the largest-number cell;

sending a retransmit request to the transmitter if some errors are not correctable;

generating a second set of parity-check symbols from the data-bit sequence stored in the transmit memory means;

sending the second set of parity-check symbols over the communications channel; and using the second set of parity-check symbols, repeating the steps of finding the parity-check bits and the parity-line bits along the parity lines in the g rows by h columns of information-memory cells, having an error;

incrementing the count of each composite cell on a composite-error graph traversed by the path of each of the parity lines having an error;

determining the largest-number cell in the composite-error graph having the largest number;

comparing the largest number to a threshold;

inverting, provided the largest number exceeds the threshold, the data bit in the information-memory cells corresponding to the largest-number cell in the composite-error graph having the largest number, thereby the new-data symbol minimizes the count in the largest-number cell.

19. A process for decoding a Schilling-Manela error correcting and detecting code comprising the steps of:
storing an encoded-data-bit sequence in memory means having $\lambda$-dimensional information-memory cells and r parity-memory cells, wherein said encoded-data-symbol sequence includes a parity-check-symbol sequence having r parity-check symbols stored in the r parity-memory cells, and a data-symbol sequence blocked and stored in the $\lambda$-dimensional information-memory cells;
finding the parity-check symbols and the parity-line symbols along the parity lines in the information-memory cells, having an error;
incrementing the count of each composite cell on a composite-error graph traversed by the path of each of the parity lines having an error;
determining the largest-number cell in the composite-error graph having the largest number;
comparing the largest number to a threshold;
determining, provided the largest number exceeds the threshold, a new-data symbol for the memory cell in the information-memory cells corresponding to the largest-number cell in the composite-error graph having the largest number, wherein the new-data symbol minimizes the count in the largest-number cell; and
substituting the new-data symbol into the stored data-symbol sequence.

20. A process for decoding a Schilling-Manela error correcting and detecting code comprising the steps of:
storing an encoded-data-symbol sequence in memory means having $\lambda$-dimensional information-memory cells and r parity-memory cells, wherein said encoded-data-symbol sequence includes a parity-check-symbol sequence having r parity-check symbols stored in the r parity-memory cells, and a data-symbol sequence having information symbols blocked and stored in the $\lambda$-dimensional information-memory cells;
finding the parity-check symbol and parity-line symbols along a first parity line in the information memory cells, having an error;
finding the parity-check symbol and parity-line symbols along a second parity line in the information memory cells, having an error;
comparing the parity-check symbols and parity-line symbols along the first and second parity lines, respectively, for determining the parity-line symbol having an error;
substituting a new-parity-line symbol for the parity-line symbol having an error so that first and second parity lines are not in error; and
outputting the corrected data-symbol sequence.

21. A process for decoding a Schilling-Manela error correcting and detecting code comprising the steps of:
storing an encoded-data-bit sequence in memory means having information-memory cells and r parity-memory cells, wherein said encoded-data-bit sequence includes a parity-check-bit sequence having r parity-check bits stored in the r parity-memory cells, and a data-bit sequence having information bits blocked and stored in the information-memory cells;
finding the parity-check bit and parity-line bits along a first parity line in the information memory cells, having an erasure; and
setting the erasure equal to the modulo 2 sum of the parity check bits plus the parity lines bits along the parity line.

22. A process for decoding a Schilling-Manela error correcting and detecting code comprising the steps of:
storing an encoded-data-symbol sequence in memory means having information-memory cells and r parity-memory cells, wherein said encoded-data-symbol sequence includes a parity-check-symbol sequence having r parity-check symbols stored in the r parity-memory cells, and a data-symbol sequence having information symbols blocked and stored in the information-memory cells;
finding the parity-check symbol and parity-line symbols along a first parity line in the information memory cells, having an erasure; and
setting the erasure equal to the modulo $2^p$ sum of the parity check symbols plus the parity lines symbols along the parity line.

23. A process for encoding a Schilling-Manela error correcting and detecting code comprising the steps of:
storing a block of a data-symbol sequence having data symbols with p-bits per symbol, in memory means having information-memory cells and parity-check memory cells;
calculating a first set of parity-check symbols from the data symbols along a first set of parity lines, by setting the parity-check symbol for each of the first set of parity-check symbols for each parity line equal to the modulo-$2^p$ sum of the data symbols along each parity line, wherein each parity line of the first set of parity lines has a path with a first slope traversing through said information-memory cells, and said first set of parity-check symbols forms a first parity row located in said parity-check memory cells;
calculating at least a second set of parity-check symbols from the data symbols along a second set of parity lines, by setting the parity-check symbol for each of the second set of parity-check symbols for each parity line equal to the modulo-$2^p$ sum of the data symbols along each parity line, wherein each parity line of the second set of parity lines has a path with a second slope traversing through said information-memory cells, and said second set of parity-check symbols form a second parity row located in said parity-check memory cells; and
outputting an encoded-data-symbol sequence comprising the data-symbol sequence and the parity-check symbols.

24. A process for encoding a Schilling-Manela error correcting and detecting code comprising the steps of:
storing a block of a data-symbol sequence having data symbols with P-bits pre symbol, in memory means having information-memory cells and parity-check memory cells;
calculating a first set of parity-check symbols from the data symbols along a first set of parity lines, by setting the parity-check symbol for each of the first set of parity-check symbols for each parity line equal to the modulo-$2^p$ sum of the data symbols along each parity line, wherein each parity line of the first set of parity lines has a path with a first slope traversing through said information-memory cells, and said first set of parity-check symbols forms a first parity row located in said parity-check memory cells;

calculating a second set of parity-check symbols from the data symbols along a second set of parity lines, by setting the parity-check symbol for each of the second set of parity-check symbols for each parity line equal to the modulo-$2^p$ sum of the data symbols along each parity line, wherein each parity line of the second set of parity lines has a path with a second slope traversing through said information-memory cells, and said second set of parity-check symbols form a second parity row located in said parity-check memory cells;

calculating at least a third set of parity-check symbols from the data symbols along a third set of parity lines, by setting the parity-check symbol for each of the third set of parity-check symbols for each parity line equal to the modulo-$2^p$ sum of the data symbols along each parity line, wherein each parity line of the third set of parity lines has a path with a third slope traversing through said information-memory cells, and said third set of parity-check symbols form a third parity row located in said parity-check memory cells; and outputting an encoded-data-symbol sequence comprising the data-symbol sequence and the parity-check symbols.

25. A process for encoding a Schilling-Manela error correcting and detecting code comprising the steps of:

storing a block of a data-symbol sequence having data symbols with p-bits per symbol, in memory means having information-memory cells and parity-check memory cells;

calculating a first set of parity-check symbols from the data symbols along a first set of parity lines, wherein each parity line of the first set of parity lines has a path with a first slope traversing through said information-memory cells;

calculating at least a second set of parity-check symbols from the data symbols along a second set of parity lines, wherein each parity line of the second set of parity lines has path with a second slope traversing through said information-memory cells; and outputting an encoded-data-symbol sequence comprising the data-symbol sequence and the parity-check symbols.

26. A process for encoding a Schilling-Manela error correcting and detecting code comprising the steps of:

storing a block of a data-symbol sequence having data symbols with p-bits per symbol, in memory means having information-memory cells and parity-check memory cells;

calculating a first set of parity-check symbols from the data symbols along a first set of parity lines, wherein each parity line of the first set of parity lines has a path with a first slope traversing through said information-memory cells;

calculating a second set of parity-check symbols from the data symbols along a second set of parity lines, wherein each parity line of the second set of parity lines has a path with a second slope traversing through said information-memory cells;

calculating at least a third set of parity-check symbols from the data symbols along a third set of parity lines, wherein each parity line of the third set of parity lines has a path with a third slope traversing through said information-memory cells; and outputting an encoded-data-symbol sequence comprising the data-symbol sequence and the parity-check symbols.

27. A process for encoding a Schilling-Manela error correcting and detecting code comprising the steps of:

storing a block of a data-symbol sequence having data symbols with p-bits per symbol, in memory means having information-memory cells and parity-check memory cells;

calculating a first set of parity-check symbols from the data symbols along a first set of parity lines, wherein each parity line of the first set of parity lines has a path with a first slope traversing through said information-memory cells;

storing said first set of parity-check symbols in a first parity row located in said parity-check memory cells;

calculating at least a second set of parity-check symbols from the data symbols along a second set of parity lines, wherein each parity line of the second set of parity lines has a path with a second slope traversing through said information-memory cells;

storing said second set of parity-check symbols in a second parity row located in said parity-check memory cells; and outputting an encoded-data-symbol sequence comprising the data-symbol sequence and the parity-check symbols.

28. A process for encoding a Schilling-Manela error correcting and detecting code comprising the steps of:

storing a block of a data-symbol sequence having data symbols with p-bits per symbol, in memory means having information-memory cells and parity-check memory cells;

calculating a first set of parity-check symbols from the data symbols along a first set of parity lines, wherein each parity line of the first set of parity lines has a path with a first slope traversing through said information-memory cells;

storing said first set of parity-check symbols in a first parity row located in said parity-check memory cells;

calculating a second set of parity-check symbols from the data symbols along a second set of parity lines, wherein each parity line of the second set of parity lines has a path with a second slope traversing through said information-memory cells;

storing said second set of parity-check symbols in a second parity row located in said parity-check memory cells;

calculating at least a third set of parity-check symbols from the data symbols along a third set of parity lines, wherein each parity line of the third set of parity lines has a path with a third slope traversing through said information-memory cells;

storing said third set of parity-check symbols in a third parity row located in said parity-check memory cells; and outputting an encoded-data-symbol sequence comprising the data-symbol sequence and the parity-check symbols.

29. A Schilling-Manela error correcting and detecting code encoding apparatus comprising:

memory means coupled to a data source for storing a block of a data-symbol sequence; and processor means coupled to said memory means for calculating first set of parity-check symbols from the data symbols along a first set of parity lines, wherein each parity line of the first set of parity lines has a path with a first slope traversing through said information-memory cells, and said first set of parity-check symbols forms a first parity row located in said parity-check memory cells, calculating at least a second set of parity-check symbols from the data symbols along a second set of parity lines, wherein each parity line of the second set of parity lines has a path with a second slope traversing through said information-memory cells, and said second set of parity-check symbols form a second parity row located in said parity-check memory cells, and outputting an encoded-data-symbol sequence comprising the data-symbol sequence and the parity-check symbols.

* * * * *